United States Patent [19]
Hayashi et al.

[11] Patent Number: 5,594,933
[45] Date of Patent: Jan. 14, 1997

[54] MAGNETORESISTANCE FILM WHICH IS A MATRIX OF AT LEAST TWO SPECIFIED METALS HAVING INCLUDED SUBMICRON PARTICLES OF A SPECIFIED MAGNETIC METAL OR ALLOY

[75] Inventors: Kazuhiko Hayashi; Hidefumi Yamamoto; Junichi Fujikata; Kunihiko Ishihara, all of Tokyo, Japan

[73] Assignee: NEC Corporation, Tokyo, Japan

[21] Appl. No.: 497,716

[22] Filed: Jun. 30, 1995

[30] Foreign Application Priority Data

Jul. 1, 1994 [JP] Japan .................................. 6-150858

[51] Int. Cl.$^6$ .................................................. H01F 10/12
[52] U.S. Cl. .......................... 428/546; 428/548; 428/553; 428/611; 428/692; 428/928
[58] Field of Search ................................... 428/611, 614, 428/546, 558, 692, 548, 553, 900, 928; 334/252; 338/32 R; 360/113

[56] References Cited

U.S. PATENT DOCUMENTS

| | | | |
|---|---|---|---|
| 4,093,453 | 6/1978 | Makino et al. | 75/129 |
| 5,158,933 | 10/1992 | Holtz et al. | 305/1 |
| 5,363,794 | 11/1994 | Lairson et al. | 117/7 |
| 5,432,734 | 7/1995 | Kawano et al. | 365/158 |
| 5,462,795 | 10/1995 | Shinto et al. | 428/332 |
| 5,462,809 | 10/1995 | Berkowitz | 428/546 |

OTHER PUBLICATIONS

John Q. Xiao et al., "Giant Magnetoresistance in Nonmultilayer Magnetic Systems", *Physical Review Letters*, vol. 68, No. 25, pp. 3749–3752 (Jun. 22, 1992).

A. E. Berkowitz et al., "Giant Magnetoresistance in Heterogeneous Cu–Co Alloys", *Physical Review Letters*, vol. 68, No. 25, pp. 3745–3748 (Jun. 22, 1992).

M. L. Watson et al., "Observation of giant magneto–resistance in Ag–Ni–Fe alloy films", *J. Appl. Phys.*, vol. 73, No. 10, pp. 5506–5508 (May 15, 1993).

H. Takeda et al., "Magnetoresistance of nano–granular noble–metal based alloys", *Japan Applied Magnetics Soc.*, Synopses of Lectures in 17th Meeting (19993) 11aA–5, p. 136.

*Primary Examiner*—Stevan A. Resan
*Attorney, Agent, or Firm*—Sughrue, Mion, Zinn, Macpeak & Seas

[57] ABSTRACT

The invention relates to a magnetoresistance material, i.e. a conductive material that exhibits magnetoresistance, which is an inhomogeneous system consisting of a nonmagnetic matrix and ultrafine particles of a ferromagnetic material such as Co or Ni—Fe—Co dispersed in the nonmagnetic matrix. With the aim of reducing deterioration of the magnetoresistance effect, an alloy or mixture of at least two metal elements selected from Cu, Ag, Au and Pt is used as the material of the nonmagnetic matrix. Optionally, the nonmagnetic matrix may contain a limited quantity of a supplementary element selected from Al, Cr, In, Mn, Mo, Nb, Pd, Ta, Ti, W, V, Zr and Ir. A film of the magnetoresistance material can be formed on a substrate, and it is optional to interpose a buffer layer between the film and the substrate and/or cover the film with a protective layer.

18 Claims, 2 Drawing Sheets

MAGNETORESISTANCE FILM WHICH IS A MATRIX OF AT LEAST TWO SPECIFIED METALS HAVING INCLUDED SUBMICRON PARTICLES OF A SPECIFIED MAGNETIC METAL OR ALLOY

BACKGROUND OF THE INVENTION

This invention relates to a magnetoresistance material, viz. a conductive material that exhibits magnetoresistance, which is an inhomogeneous system consisting of a nonmagnetic matrix and ultrafine particles of a ferromagnetic material dispersed in the nonmagnetic matrix. Herein, the term "nonmagnetic" is in the sense of non-ferromagnetic and is inclusive of paramagnetic and diamagnetic. The magnetoresistance material can be formed as a film on a substrate and is useful, for example, in magnetic heads for writing/erasing information.

It is well known that magnetoresistance occurs in some magnetic multilayer systems consisting of at least one ferromagnetic layer, e.g. Co layer, and at least one nonmagnetic layer, e.g. Cu layer.

Besides, recent reports have disclosed magnetoresistance in nonlayered inhomogeneous systems in which ultrafine particles of a ferromagnetic material are dispersed in a nonmagnetic matrix: Berkowitz et al., Physical Review Letters, Vol. 68 (1992), pp. 3745–3748, and Xiao et al., ibid., pp. 3749–3752. Such inhomogeneous systems are sometimes called magnetic granular systems. Usually the inhomogeneous granular systems are in the form of films. For such systems various combinations of ferromagnetic and nonmagnetic materials have already been reported; such as Co/Cu, Fe/Ag, Co/Ag, Co/Au, Co—Fe/Ag, Ni—Co/Ag, Ni—Fe/Cu, Fe/Mg, Co—Fe/Cu, Ni—Fe/Ag, Ni—Fe—Co/Ag, etc.

A problem in the inhomogeneous granular systems is that the magnitude of magnetoresistance decreases when the films are long kept in the atmosphere. Herein, the magnitude of magnetoresistance will be referred to as MR change which is given by $(R_{max}-R_{min})/R_{min}\times100$ (%), where $R_{max}$ and $R_{min}$ are the maximum and minimum resistances measured by varying the applied magnetic field. There are three possible reasons for the aging decrease in MR change.

First, there is a possibility that an alloy forms at the interfaces between the magnetic particles and the nonmagnetic material by interfacial diffusion. If an alloy formes at the interfaces the interfacial scattering of electrons becomes indistinct, and differences in the degree of the interfacial scattering with the directions of magnetization in the magnetic particles decrease, and consequently MR change decreases.

Another possible reason is oxidation of the nonmagnetic matrix. Partial oxidation of the nonmagnetic matrix causes an increase in the electron scattering in the nonmagnetic matrix and hence induces a relative decrease in the interfacial scattering. Also in this case the dependence of the interfacial scattering on the directions of magnetization of the magnetic particles reduces, and consequently MR change decreases.

The third possible reason is oxidation of the magnetic particles mostly in the particle surface regions. Since metal oxides are very high in electrical resistance, the metal oxide on the particle surfaces constitutes a serious obstacle to the interfacial scattering of electrons, and therefore MR change decreases.

Probably the above three possible phenomena actually occur altogether.

SUMMARY OF THE INVENTION

It is an object of the present invention to provide a magnetoresistance material of the type containing ferromagnetic particles in a nonmagnetic matrix, which is improved in durability and, possibly, also in the magnitude of magnetoresistance.

A magnetoresistance material according to the invention consists essentially of a matrix of a conductive nonmagnetic material and submicron particles of a conductive ferromagnetic material dispersed in the nonmagnetic matrix and is characterized in that the nonmagnetic material comprises at least two metal elements selected from Cu, Ag, Au and Pt.

In this invention it is an option to add a supplementary metal element to the above-stated nonmagnetic material by selecting the supplementary element from Al, Cr, In, Mn, Mo, Nb, Pd, Ta, Ti, W, V, Zr and Ir. The amount of the supplementary element is limited to 10 atomic percent at the maximum. If desired, two or more supplementary elements may be added jointly on condition that the total amount of the supplementary elements is not more than 10 atomic percent.

A magnetoresistance material according to the invention can be formed as a film on a substrate. It is optional to interpose a buffer layer between the film and the substrate and/or cover the film with a protective layer.

We have discovered that aging deterioration of magnetoresistance materials containing ferromagnetic particles in respect of MR change is appreciably suppressed when any combination of Cu, Ag, Au and Pt is used as the nonmagnetic material, while the initial value of MR change remains almost unchanged or slightly increases in some cases.

The reasons for the improved characteristics are not fully ellucidated yet. However, a probable reason is that the interfaces between the ferromagnetic particles and the nonmagnetic matrix become distinct when the nonmagnetic matrix is a combination of a plurality of suitably selected elements.

Multilayer systems using Cu in combination with a ferromagnetic material exhibits relatively large MR changes. However, when particles of the same ferromagnetic material are dispersed in Cu matrix MR change is not so large. This is primarily because the interfaces between the magnetic particles and the Cu matrix become indistinct since Cu readily forms solid solutions with the elements of the magnetic material. In the case of using Au or Pt as nonmagnetic material the interfaces between the ferromagnetic particles and the nonmagnetic matrix become very distinct since Au and Pt hardly form solid solutions with representative ferromagnetic elements such as Fe, Ni and Co. However, the granular systems using Au or Pt do not exhibit large MR changes by reason of the configuration of electrons. In these respects, Ag is intermediate between Cu and either Au or Pt. In the case of a nonmagnetic matrix produced by mixing or alloying Cu with a suitable quantity of Ag, Au and/or Pt the interfaces between the matrix and the dispersed ferromagnetic particles, but this nonmagnetic matrix does not greatly differ from pure Cu matrix in the configuration of electrons.

Among the metal elements for supplementary use, Al, Cr, In, Mn, Nb, Mo, Ta, Ti, W and V have the property of adsorbing oxygen. Therefore, the addition of any of these metals to the nonmagnetic matrix is effective for the prevention of oxidation of the essential elements of the nonmagnetic matrix and consequential decrease of magnetoresistance. The addition of any of Pd, Zr and Ir to the nonmagnetic matrix causes lowering of the wettability of the ferromagnetic particles with the nonmagnetic matrix and, hence, makes a contribution to the formation of distinct interfaces between the particles and the matrix and to the suppression of aging deterioration of the magnetoresistance effect.

DESCRIPTION OF THE PREFERRED EMBODIMENTS

Figure 1:
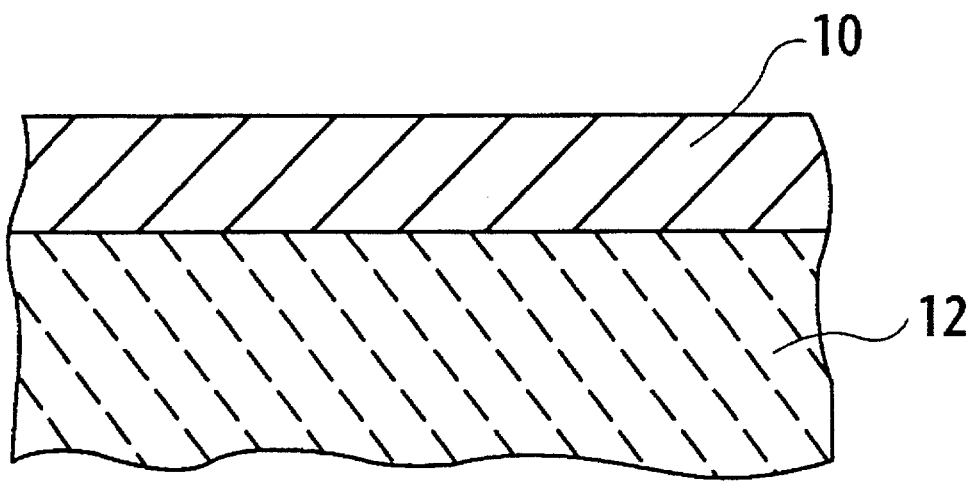
FIG. 1 shows, in a schematic sectional view, a film of a magnetoresistance material according to the invention on a substrate.

In this invention a known ferromagnetic material is used. It is preferred to use Co, Ni—Fe alloy, Ni—Fe—Co alloy or Fe—Co alloy.

In a magnetoresistance material according to the invention the ferromagnetic material is in the form of very small particles. Although there is not a strict limitation, it is preferable that the particle sizes are in the range from 2 to 30 nm. The amount of the ferromagnetic particles is not strictly limited, but it is preferable that the ferromagnetic particles occupy from 10 to 30% by volume of the magnetoresistance material.

In this invention the nonmagnetic material contains at least two metal elements selected from Cu, Ag, Au and Pt. The two-component or multicomponent nonmagnetic material may be either an alloy or a nonalloyed or partly alloyed mixture. There are no strict limitations on the minimum and maximum amounts of each metal element in this nonmagnetic material. However, in order to fully gain the merits of using a combination of at least two elements, generally it is suitable that any of the selected elements is not less than 5 at % (atomic percent) and not more than 95 at %. In the cases of two-component systems using Cu and Ag, Ag and Au, or Au and Pt, the proportions of the two elements are freely variable, though it is suitable that neither of the two elements is more than 95 at %. In the combination of Cu and Au it is suitable that Au is not more than 60 at %. In the combination of Cu and Pt it is suitable that Pt is not more than 30 at %. In the combination of Ag and Pt it is suitable that Pt is not more than 50 at %. In the combination of Cu, Ag and Au it is suitable that Au is not more than 60 at %, and the proportion of Cu to Ag is arbitrary. In the combination of Cu, Ag and Pt it is suitable that Pt is not more than 50 at %, and the proportion of Cu to Ag is arbitrary. In the combination of Cu, Au and Pt it is suitable that Cu is not more than 50 at %, and the proportion of Au to Pt is arbitrary. In the combination of Ag, Au and Pt it is suitable that Pt is not more than 50 at %, and the proportion of Ag to Au is arbitrary. In the combination of Cu, Ag, Au and Pt, it is suitable that both Au and Pt are not more than 50 at %.

To any combination of at least two of Cu, Ag, Au and Pt, it is optional to add a supplementary metal element selected from Al, Cr, In, Mn, Mo, Nb, Pd, Ta, Ti, W, V, Zr and Ir. If desired, two or more supplementary elements selected from the same group may be added. The maximum amount of the supplementary element (total amount in the case of adding two or more elements) in the multicomponent nonmagnetic material is 10 at %.

A magnetoresistance material according to the invention can be produced by a heat treatment of a suitable mixture of the above described nonmagnetic material and a ferromagnetic material to cause precipitation of only the ferromagnetic material as ultrafine particles.

Usually a magnetoresistance material according to the invention is produced in the form of a film on a substrate. To produce the magnetoresistance film, first a film of a mixture of the nonmagnetic material and the ferromagnetic material is formed on a substrate by a sputtering technique or a vapor deposition technique. The sputtering or vapor deposition is performed so as to deposit the nonmagnetic and ferromagnetic materials simultaneously or alternately. In the case of alternate deposition, each layer of the deposited nonmagnetic or ferromagnetic material is made thinner than 1 nm. In sputtering the nonmagnetic and ferromagnetic materials are sputtered as separate targets, or as a mixture target or a composite target. The deposited film is annealed in vacuum at a temperature suited to optimization of the particle sizes of the ferromagnetic material. The annealing temperature is in the range from 250° to 600° C. and depends on the kinds of the nonmagnetic and ferromagnetic materials. The annealing time is also determined so as to optimize the particle sizes.

FIG. 1 shows a magnetoresistance film 10 according to the invention on a substrate 12. The material of the substrate 12 can be selected from metals, glasses, ceramics and plastics and may be a mixture of two or more different materials. The substrate 12 may be a laminate. When a metal substrate is used, it is possible to improve the crystallinity of the nonmagnetic matrix of the magnetoresistance film 10 by attempting to match of the crystal lattice of the substrate metal with that of the nonmagnetic material to be deposited. The MR change of the film 10 tends to augment by good crystallinity of the nonmagnetic matrix.

Figure 2:
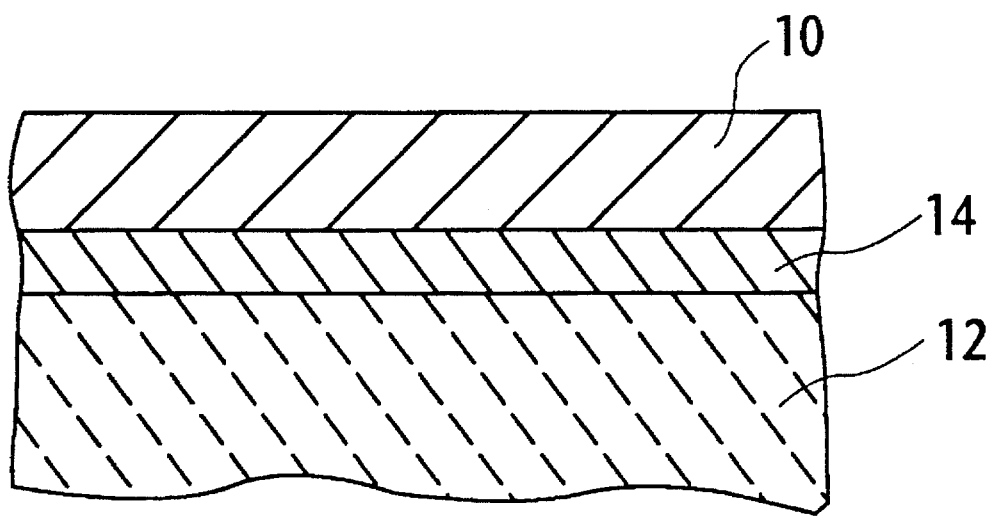
FIG. 2 shows interposing a buffer layer between the magnetoresistance film in FIG. 1 and the substrate.

Referring to FIG. 2, it is an option to provide a buffer layer 14 between the substrate 12 and the magnetoresistance film 10. The material of the buffer layer 14 can be selected from metals such as Ta, Hf, Si, Au, Pt, Ag, Cu, Ti, Mn, Cr and Al, including alloys and mixtures of these elements, and nonmetallic materials such as silicon oxide, silicon nitride, aluminum oxide, aluminum nitride, silicon carbide and carbon, including mixtures of these nonmetallic materials, and mixtures of the metals and the nonmetallic materials. The buffer layer 14 may have a two-layer or multilayer structure.

When the substrate 12 is a glass or ceramic, it is possible to improve the crystallinity of the nonmagnetic matrix of the magnetoresistance film 10 by using a suitable metal, or suitable metals, as the buffer layer 14. When the substrate 12 is a plastic or a certain kind of glass or ceramic, there is a possibility that the magnetoresistance effect of the film 10 deteriorates by the influence of moisture contained in the substrate. In such a case the film 10 can be shielded from the unfavorable influence of the substrate by suitably selecting the material of the buffer layer 14 from the aforementioned nonmetallic materials. With a view to improving both durability of the magnetoresistance film 10 and crystallinity of the nonmagnetic matrix of the film 10, the buffer layer 14 may have a two-layer or multilayer structure consisting of at least one nonmetallic layer adjacent to the substrate 12 and at least one metal layer adjacent to the film 10.

Figure 3:
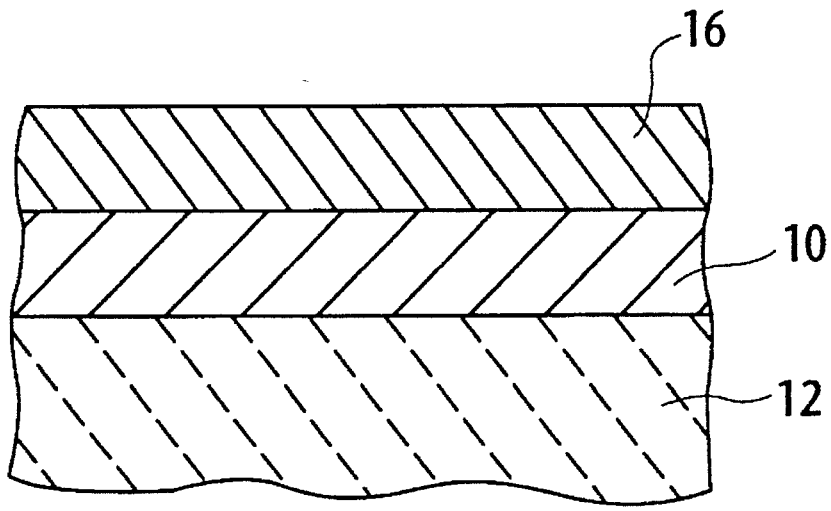
FIG. 3 shows covering the magnetoresistance film in FIG. 1 with a protective layer.

Referring to FIG. 3, it is another option to overlay the magnetoresistance film 10 with a protective layer 16 to shield the film 10 from the atmosphere and consequently improve the corrosion resistance and durability of the film 10. The material of the protective layer 16 can be selected from metals such as Ta, Hf, Si, Au, Pt, Ag, Ti, Cr and Al, including alloys and mixtures of these elements, and nonmetallic materials such as silicon oxide, silicon nitride, aluminum oxide, aluminum nitride, silicon carbide and carbon, including mixtures of these nonmetallic materials, and mixtures of the metals and the nonmetallic materials. The protective layer 16 may have a two-layer or multilayer structure.

Figure 4:
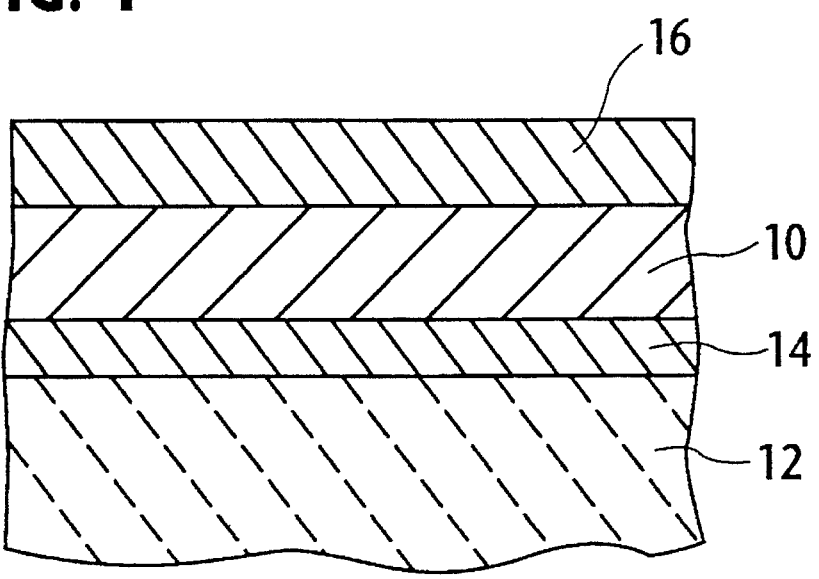
FIG. 4 shows covering the magnetoresistance film in FIG. 2 with a protective layer.

FIG. 4 shows a case where the magnetoresistance film 10 is provided with both the buffer layer 14 of FIG. 2 and the protective layer 16 of FIG. 3.

EXAMPLE 1

This example corresponds to FIG. 1. The magnetoresistance film 10 was formed on a glass substrate 12. As the ferromagnetic material, Fe—Ni—Co alloy was used. As the nonmagnetic material, various combinations of Cu, Ag, Au and/or Pt were alternately used as shown in Table 1. In the compositions in Table 1, the subscript numerals indicate the proportions of the metal elements in atomic percent. In every case the film 10 was deposited on the substrate 12 to a thickness of 50 nm by a vapor deposition technique and then annealed for 3 h at a temperature in the range from 320°° to 400° C. The annealing temperature was suitably chosen according to the composition of the nonmagnetic material. In the films 10 of this example, the nonmagnetic matrix was an alloy in the cases of $Cu_{50}Au_{50}$ and $Ag_{80}Au_{20}$, an unalloyed mixture in the cases of $Cu_{20}Ag_{80}$, $Cu_{20}Ag_{70}Au_{10}$, $Cu_{20}Ag_{70}Pt_{10}$ and $Ag_{60}Au_{15}Cu_{15}Pt_{10}$, but uncertain in other cases.

For comparison, Ag was singly used as the nonmagnetic material.

MR changes of these films were measured. After that the films were subjected to an accelerated aging test in a constant-temperature constant-humidity oven kept at 80° C. and 90% RH to determine the length of time, $t_{10}$, elapsed until 10% decrease of MR change from the initial value. The results are shown in Table 1.

TABLE 1

Ferromagnetic Material: Ni—Fe—Co alloy

| Nonmagnetic Material | MR change (%) | Durability $t_{10}$ (h) |
|---|---|---|
| $Cu_{20}Ag_{80}$ | 11 | 113 |
| $Cu_{50}Au_{50}$ | 10 | 120 |
| $Cu_{80}Pt_{20}$ | 11 | 121 |
| $Ag_{80}Au_{20}$ | 9 | 156 |
| $Ag_{80}Pt_{20}$ | 8 | 151 |
| $Au_{70}Pt_{30}$ | 7 | 182 |
| $Cu_{20}Ag_{70}Au_{10}$ | 11 | 135 |
| $Cu_{20}Ag_{70}Pt_{10}$ | 10 | 129 |
| $Ag_{70}Au_{20}Pt_{10}$ | 9 | 162 |
| $Ag_{60}Au_{15}Cu_{15}Pt_{10}$ | 11 | 159 |
| Ag | 9 | 112 |

EXAMPLE 2

Example 1 was modified only in respect of the ferromagnetic material and the annealing temperature. In this example the ferromagnetic material was Ni—Fe alloy, and the annealing temperature was made lower than than in Example 1 by 20° C. The test results are shown in Table 2.

TABLE 2

Ferromagnetic Material: Ni—Fe alloy

| Nonmagnetic Material | MR change (%) | Durability $t_{10}$ (h) |
|---|---|---|
| $Cu_{20}Ag_{80}$ | 8 | 126 |
| $Cu_{50}Au_{50}$ | 7 | 130 |
| $Cu_{80}Pt_{20}$ | 6 | 136 |
| $Ag_{80}Au_{20}$ | 7 | 166 |
| $Ag_{80}Pt_{20}$ | 7 | 178 |
| $Au_{70}Pt_{30}$ | 6 | 174 |
| $Cu_{20}Ag_{70}Au_{10}$ | 8 | 139 |
| $Cu_{20}Ag_{70}Pt_{10}$ | 8 | 144 |
| $Ag_{70}Au_{20}Pt_{10}$ | 7 | 182 |
| $Ag_{60}Au_{15}Cu_{15}Pt_{10}$ | 7 | 171 |
| Ag | 7 | 110 |

EXAMPLE 3

Example 1 was modified in respect of the ferromagnetic material, substrate material and the annealing temperature. In this example the ferromagnetic material was Co, and the substrate material was alumina. The annealing temperature was made higher than that in Example 1 by 30°–50° C. The test results are shown in Table 3.

TABLE 3

Ferromagnetic Material: Co

| Nonmagnetic Material | MR change (%) | Durability $t_{10}$ (h) |
|---|---|---|
| $Cu_{20}Ag_{80}$ | 22 | 122 |
| $Cu_{50}Au_{50}$ | 23 | 134 |
| $Cu_{80}Pt_{20}$ | 21 | 141 |
| $Ag_{80}Au_{20}$ | 18 | 184 |
| $Ag_{80}Pt_{20}$ | 17 | 187 |
| $Au_{70}Pt_{30}$ | 11 | 190 |
| $Cu_{20}Ag_{70}Au_{10}$ | 24 | 140 |
| $Cu_{20}Ag_{70}Pt_{10}$ | 20 | 143 |
| $Ag_{70}Au_{20}Pt_{10}$ | 13 | 188 |
| $Ag_{60}Au_{15}Cu_{15}Pt_{10}$ | 18 | 165 |
| Ag | 20 | 106 |

In Tables 1 to 3 it is seen that, by comparison with the known magnetoresistance film using Ag as the nonmagnetic material, the magnetroresistance films according to the invention were better in durability represented by $t_{10}$ and approximately equivalent or even greater in MR change.

EXAMPLE 4

This example also corresponds to the structure shown in FIG. 1. Ni—Fe—Co alloy was used as the ferromagnetic material in the magnetoresistance film 10, and $Ag_{50}Cu_{50}$ and $Ag_{50}Au_{50}$ were alternately used as the nonmagnetic material. As shown in Table 4, various kinds of supplementary metal elements were alternately added to both $Ag_{50}Cu_{50}$ and $Ag_{50}Au_{50}$. The substrate 12 was of $SiO_2$ when $Ag_{50}Cu_{50}$ was used and of glass when $Ag_{50}Au_{50}$ was used. The films 10 were produced by the same method as in Example 1 and had a thickness of 50 nm. The measurements of MR change and $t_{10}$ were as shown in Table 4. It is seen that the supplementary elements were effective for enhancement of the durability of the magnetoresistance films.

TABLE 4

Ferromagnetic Material: Ni—Fe—Co alloy

| | | $Ag_{50}Cu_{50}$ base | | $Ag_{50}Au_{50}$ base | |
|---|---|---|---|---|---|
| Supplementary Element (at %) | | MR change (%) | $t_{10}$ (h) | MR change (%) | $t_{10}$ (h) |
| — | | 10 | 115 | 9 | 120 |
| Al | (3) | 8 | 117 | 7 | 122 |
| Cr | (2) | 9 | 135 | 8 | 138 |
| In | (6) | 9 | 119 | 9 | 123 |
| Mn | (2) | 9 | 124 | 8 | 127 |
| Mo | (3) | 9 | 127 | 9 | 130 |
| Nb | (2) | 8 | 126 | 8 | 126 |
| Pd | (5) | 8 | 133 | 9 | 137 |
| Ta | (4) | 9 | 139 | 8 | 137 |
| Ti | (5) | 10 | 142 | 8 | 138 |
| W | (4) | 8 | 128 | 8 | 129 |
| V | (3) | 9 | 124 | 8 | 125 |
| Zr | (7) | 9 | 135 | 9 | 127 |
| Ir | (8) | 9 | 136 | 9 | 133 |

EXAMPLE 5

This example corresponds to FIG. 2 showing the addition of the buffer layer 14. Ni—Fe—Co alloy was used as the ferromagnetic material in the magnetoresistance film 10, and $Ag_{50}Cu_{50}$ and $Ag_{50}Au_{50}$ were alternately used as the nonmagnetic material. The substrate 12 was of glass when $Ag_{50}Cu_{50}$ was used and of ferrite when $Ag_{50}Au_{50}$ was used. Various metals were alternately used as the material of the buffer layer 14 as shown in Table 5, wherein the subscript numerals indicate the proportions of metal elements in atomic percent. In every case the buffer layer 14 was formed by vapor deposition, and the magnetoresistance film 10 was produced by the same method as in Example 1. The film 10 was 50 nm in thickness. The measurements of MR change and $t_{10}$ were as shown in Table 5.

TABLE 5

Ferromagnetic material: Ni—Fe—Co alloy
Nonmagnetic material: $Ag_{50}Cu_{50}$ or $Ag_{50}Au_{50}$

| Buffer Layer (thickness: nm) | | MR change (%) | |
|---|---|---|---|
| | | $Ag_{50}Cu_{50}$ | $Ag_{50}Au_{50}$ |
| Ta | (10) | 13 | 9 |
| Hf | (10) | 12 | 9 |
| Si | (5) | 6 | 6 |
| Au | (10) | 11 | 8 |
| Pt | (10) | 12 | 7 |
| Ag | (10) | 9 | 8 |
| Cu | (10) | 8 | 8 |
| Ti | (10) | 9 | 9 |
| Mn | (5) | 8 | 7 |
| Cr | (5) | 11 | 7 |
| Al | (5) | 8 | 7 |
| $Ta_{50}Hf_{50}$ | (10) | 14 | 9 |
| $Ta_{60}Pt_{40}$ | (10) | 15 | 10 |
| $Ta_{50}Ti_{50}$ | (10) | 14 | 10 |
| $Ta_{60}Cr_{40}$ | (10) | 14 | 9 |
| $Hf_{50}Au_{50}$ | (10) | 15 | 9 |
| $Hf_{40}Pt_{60}$ | (10) | 14 | 8 |
| $Hf_{50}Cu_{50}$ | (10) | 13 | 8 |
| $Hf_{50}Ti_{50}$ | (10) | 13 | 10 |
| $Ta_{30}Hf_{30}Ti_{40}$ | (10) | 15 | 10 |

EXAMPLE 6

Example 5 was modified only in respect of the materials of the substrate 12 and the buffer layer 14. In this example the substrate was of glass when $Ag_{50}Cu_{50}$ was used in the magnetoresistance film 10 and of polycarbonate when $Ag_{50}Au_{50}$ was used. As shown in Table 6, various nonmetallic materials were alternately used as the material of the buffer layer. In several cases the buffer layer had a two-layer or three-layer structure using a nitride or oxide in the bottom layer and a metal in the top layer. In every case the buffer layer was formed by vapor deposition. The measurements of MR change and $t_{10}$ were as shown in Table 6.

TABLE 6

Ferromagnetic material: Ni—Fe—Co alloy
Nonmagnetic material: $Ag_{50}Cu_{50}$ or $Ag_{50}Au_{50}$

| Buffer Layer (thickness: nm) | MR change (%) | |
|---|---|---|
| | $Ag_{50}Cu_{50}$ | $Ag_{50}Au_{50}$ |
| $Si_3N_4$ (80) | 11 | 11 |
| $SiO_2$ (100) | 12 | 11 |
| $Al_2O_3$ (50) | 12 | 10 |
| AlN (80) | 11 | 10 |
| SiC (80) | 10 | 9 |
| diamond-like carbon (80) | 12 | 10 |
| $Si_3N_4$/Ta two-layer (80)/(10) | 12 | 14 |
| $SiO_2$/Hf two-layer (80)/(10) | 13 | 15 |
| $Al_2O_3$/Ti two-layer (80)/(10) | 12 | 13 |
| AlN/Cr/Ti three-layer (80)/(5)/(5) | 15 | 15 |

EXAMPLE 7

This example corresponds to FIG. 3 showing the addition of the protective layer 16. The substrate 12 was of $SiO_2$. In the magnetoresistance film 10 the ferromagnetic material was Ni—Fe—Co alloy, and the nonmagnetic material was $Ag_{50}Cu_{50}$. The film 10, 50 nm in thickness, was produced by the same method as in Example 1. The material of the protective layer 16 was varied as shown in Table 7, wherein the subscript numerals indicate the proportions of elements in atomic percent. In several cases the protective layer 16 had a two-layer or three-layer structure using a metal in the bottom layer and a nitride or oxide in the top layer. In every case the protective layer was formed by vapor deposition. The measurements of MR change and $t_{10}$ were as shown in Table 7. It is apparent that the protective layer 16 is effective for enhancement of durability of the magnetoresistance film 10.

EXAMPLE 8

Referring to FIG. 4, Example 7 was modified by interposing a buffer layer 14 between the substrate 12 and the magnetoresistance film 10. In this example the substrate 12 was of a polyolefin rsin, and the buffer layer 14 was a laminate of a 80 nm thick $Si_3N_4$ film and a 20 nm thick film of Ta. Both the magnetoresistance film 10 and protective layers 16 were the same as in Example 7. The measurements of MR change and $t_{10}$ were as shown in Table 7.

TABLE 7

Ferromagnetic material: Ni—Fe—Co alloy
Nonmagnetic material: $Ag_{50}Cu_{50}$

| Protective Layer (thickness: nm) | | $t_{10}$ (h) Ex. 7 (without buffer layer) | Ex. 8 (with buffer layer) |
|---|---|---|---|
| — | | 115 | 121 |
| Ta | (2) | 140 | 144 |
| Hf | (2) | 145 | 146 |
| Si | (2) | 119 | 132 |
| Au | (2) | 172 | 189 |
| Pt | (2) | 178 | 187 |
| Ag | (2) | 165 | 177 |
| Ti | (2) | 166 | 176 |
| Cr | (2) | 146 | 169 |
| Al | (2) | 127 | 137 |
| $Au_{50}Pt_{50}$ | (2) | 179 | 192 |
| $Ag_{50}Cu_{50}$ | (2) | 166 | 184 |
| $Cu_{50}Ti_{50}$ | (2) | 164 | 179 |
| $Cu_{50}Cr_{50}$ | (2) | 168 | 177 |
| $Au_{50}Cr_{50}$ | (2) | 169 | 186 |
| $Si_3N_4$ | (80) | 172 | 197 |
| $SiO_2$ | (80) | 163 | 187 |
| $Al_2O_3$ | (80) | 168 | 195 |
| AlN | (80) | 166 | 196 |
| SiC | (80) | 154 | 182 |
| diamond-like carbon | (80) | 175 | 199 |
| Au/$Si_3N_4$ two-layer | (2)/(80) | 188 | 201 |
| Cu/$SiO_2$ two-layer | (2)/(80) | 181 | 192 |
| Pt/$Al_2O_3$ two-layer | (2)/(80) | 184 | 212 |
| Ta/Ag/AlN three-layer (2)/(2)/(80) | | 187 | 206 |

What is claimed is:

1. A magnetoresistance film, which is a film of a magnetoresistance material consisting essentially of a matrix of a conductive nonmagnetic material and submicron particles of a conductive ferromagnetic material dispersed in said matrix, formed on a substrate,
   wherein said nonmagnetic material comprises at least two metal elements selected from the group consisting of Cu, Ag, Au and Pt, and wherein said ferromagnetic material is selected from the group consisting of Co, Ni—Fe alloys, Ni—Fe—Co alloys and Fe—Co alloys.

2. A magnetoresistance film according to claim 1, wherein said nonmagnetic material further comprises at least one supplementary element selected from the group consisting of Al, Cr, In, Mn, Mo, Nb, Pd, Ta, Ti, W, V, Zr and Ir on condition that the total content of said at least one supplementary element is not more than 10 atomic percent.

3. A magnetoresistance film according to claim 1, wherein the particle sizes of said particles are in the range from 2 to 30 nm.

4. A magnetoresistance film according to claim 1, wherein said particles amount to 10 to 70% by volume of the magnetoresistance material.

5. A magnetoresistance film according to claim 1, wherein the film is laid on a buffer layer which overlies said substrate.

6. A magnetoresistance film according to claim 5, wherein said buffer layer comprises at least one metal material selected from the group consisting of Ta, Hf, Si, Au, Pt, Ag, Cu, Ti, Mn, Cr and Al, including alloys and mixtures thereof.

7. A magnetoresistance film according to claim 5, wherein said buffer layer comprises at least one nonmetallic material selected from the group consisting of silicon oxide, silicon nitride, aluminum oxide, aluminum nitride, silicon carbide and carbon, including mixtures thereof.

8. A magnetoresistance film according to claim 7, wherein said buffer layer further comprises at least one metal material selected from the group consisting of Ta, Hf, Si, Au, Pt, Ag, Cu, Ti, Mn, Cr and Al, including alloys and mixtures thereof.

9. A magnetoresistance film according to claim 8, wherein said buffer layer has a laminate structure comprising at least one metal layer and at least one nonmetallic layer.

10. A magnetoresistance film according to claim 1, wherein the film is overlaid with a protective layer.

11. A magnetoresistance film according to claim 10, wherein said protective layer comprises at least one metal material selected from the group consisting of Ta, Hf, Si, Au, Pt, Ag, Ti, Cr and Al, including alloys and mixtures thereof.

12. A magnetoresistance film according to claim 10, wherein said protective layer comprises at least one nonmetallic material selected from the group consisting of silicon oxide, silicon nitride, aluminum oxide, silicon carbide and carbon, including mixtures thereof.

13. A magnetoresistance film according to claim 12, wherein said protective layer further comprises at least one metal material selected from the group consisting of Ta, Hf, Si, Au, Pt, Ag, Ti, Cr and Al, including alloys and mixtures thereof.

14. A magnetoresistance film according to claim 13, wherein said protective layer has a laminate structure comprising at least one metal layer and at least one nonmetallic layer.

15. A magnetoresistance film according to claim 10, wherein the film is laid on a buffer layer which overlies said substrate.

16. The magnetoresistance film according to claim 1, wherein said nonmagnetic material comprises a combination of two metal elements selected from the group consisting of (i) Cu and Ag, (ii) C and Au, (iii) Cu and Pt, (iv) Ag and Au, (v) Ag and Pt, and (vi) Au and Pt.

17. The magnetoresistance film according to claim 1, wherein said nonmagnetic material comprises a combination of three metal elements selected from the gruop consisting of (i) Cu, Ag and Au, (ii) Cu, Ag and Pt, (iii) Cu, Au and Pt, and (iv) Ag, Au and Pt.

18. The magnetoresistance film according to claim 1, wherein said nonmagnetic material comprises a combination of Cu, Ag, Au and Pt.

* * * * *